(12) United States Patent
Hsu et al.

(10) Patent No.: US 7,722,785 B2
(45) Date of Patent: *May 25, 2010

(54) ELECTRICALLY CONDUCTIVE POLYMER COMPOSITIONS

(75) Inventors: Che-Hsiung Hsu, Wilmington, DE (US); Sunghan Kim, Goleta, CA (US); Charles J. Dubois, Wilmington, DE (US); Christopher P. Junk, Wilmington, DE (US); Andrew Edward Feiring, Wilmington, DE (US); Zhen-Yu Yang, Hockessin, DE (US); Amy Qi Han, legal representative, Hockessin, DE (US); Mark F. Teasley, Landenberg, PA (US); Viacheslav A. Petrov, Hockessin, DE (US)

(73) Assignees: E.I. du Pont de Nemours and Company, Wilmington, DE (US); Dupont Displays Inc., Wilmington, DE (US)

(*) Notice: Subject to any disclaimer, the term of this patent is extended or adjusted under 35 U.S.C. 154(b) by 401 days.

This patent is subject to a terminal disclaimer.

(21) Appl. No.: 11/475,702

(22) Filed: Jun. 27, 2006

(65) Prior Publication Data
US 2007/0066755 A1 Mar. 22, 2007

Related U.S. Application Data

(60) Provisional application No. 60/694,278, filed on Jun. 27, 2005.

(51) Int. Cl.
*H01B 1/12* (2006.01)
*H01B 1/20* (2006.01)
(52) U.S. Cl. .................. 252/500; 257/40; 430/529; 525/182; 525/186; 528/210; 528/373

(58) Field of Classification Search ................. 252/500; 525/182, 186; 430/529; 528/373, 210; 257/40
See application file for complete search history.

(56) References Cited

U.S. PATENT DOCUMENTS

| 3,282,875 | A | 11/1966 | Connolly et al. |
| 3,784,399 | A | 1/1974 | Grot |
| 4,358,545 | A | 11/1982 | Ezzell et al. |

(Continued)

FOREIGN PATENT DOCUMENTS

EP 0593111 A1 * 9/1993

(Continued)

OTHER PUBLICATIONS

Pickup, Peter G. et al., Electronically Conducting Cation-exchange Polymer Powders: Sythesis, Characterization and Applications in PEM Fuel Cells and Supercapacitors, Journal of New Materials for Electrochemical Systems, Nov. 1999, pp. 21-26, 3.*

(Continued)

*Primary Examiner*—Mark Kopec
*Assistant Examiner*—Khanh Tuan Nguyen
(74) *Attorney, Agent, or Firm*—John H. Lamming

(57) ABSTRACT

The present disclosure relates to electrically conductive polymer compositions, comprising at least one electrically conductive copolymer; and at least one fluorinated acid polymer, their use in organic electronic devices, and methods for preparation.

28 Claims, 1 Drawing Sheet

U.S. PATENT DOCUMENTS

| | | | |
|---|---|---|---|
| 4,433,082 | A | 2/1984 | Grot |
| 4,568,483 | A * | 2/1986 | Naarmann et al. .......... 252/500 |
| 4,940,525 | A | 7/1990 | Ezzell et al. |
| 5,281,680 | A | 1/1994 | Grot |
| 5,300,575 | A | 4/1994 | Jonas et al. |
| 5,463,005 | A | 10/1995 | Desmarteau |
| 6,150,426 | A | 11/2000 | Curtin et al. |
| 6,303,238 | B1 | 10/2001 | Thompson et al. |
| 6,670,645 | B2 | 12/2003 | Grushin et al. |
| 6,685,853 | B1 * | 2/2004 | Angelopoulos et al. ..... 252/500 |
| 6,955,772 | B2 * | 10/2005 | Van den Bogaert ......... 252/500 |
| 7,338,620 | B2 * | 3/2008 | Hsu et al. ................... 252/500 |
| 2001/0016303 | A1 * | 8/2001 | Majumdar et al. .......... 430/529 |
| 2002/0146442 | A1 | 10/2002 | Sendelbach et al. |
| 2003/0222250 | A1 * | 12/2003 | Hsu ........................... 252/500 |
| 2004/0044214 | A1 | 3/2004 | Andriessen |
| 2004/0064152 | A1 | 4/2004 | Zyuloni |
| 2004/0102577 | A1 * | 5/2004 | Hsu et al. ................... 525/182 |
| 2004/0126666 | A1 | 7/2004 | Cao et al. |
| 2004/0127637 | A1 | 7/2004 | Hsu et al. |
| 2004/0149962 | A1 | 8/2004 | Andriessen |
| 2005/0033015 | A1 | 2/2005 | Pei |
| 2005/0064152 | A1 | 3/2005 | Aylward et al. .......... 428/195.1 |
| 2006/0076557 | A1 * | 4/2006 | Waller et al. ................. 257/40 |
| 2007/0129534 | A1 * | 6/2007 | Ohata et al. ................ 528/373 |

FOREIGN PATENT DOCUMENTS

| | | | |
|---|---|---|---|
| EP | 1 026 152 B1 | | 8/2000 |
| JP | 2003-158043 | * | 5/2003 |
| WO | WO 98/31716 A1 | | 7/1998 |
| WO | WO 99/52954 A1 | | 10/1999 |
| WO | WO 00/70655 A2 | | 11/2000 |
| WO | WO 01/41512 A1 | | 6/2001 |
| WO | WO 03/006537 A1 | | 1/2003 |
| WO | WO 03/008424 A1 | | 1/2003 |
| WO | WO 03/040257 A1 | | 5/2003 |
| WO | WO 03/063555 A1 | | 7/2003 |
| WO | WO 03/091688 A2 | | 11/2003 |
| WO | WO 2004/016710 A1 | | 2/2004 |

OTHER PUBLICATIONS

PCT International Search Report and Written Opinion for International Application No. PCT/US 06/25012 dated Oct. 26, 2007.

U.S. Appl. No. 60/105,662, filed Oct. 25, 1999, Zhen-Yu Yang et al.

U.S. Appl. No. 60/176,881, filed Jan. 19, 2000, Jose M. Rodriguez-Parada.

Kyunghoon Lee et. al., Poly(Thieno[3,4-b]Thiophene). A New Stable Low Band Gap Conducting Polymer, Macromolecules, 2001, vol. 34:5746-5747.

Gregory A. Sotzing et. al., Poly(Thieno[3,4-b]Thiophene): A p- and η-Dopable Polythiophene Exhibiting High Optical Transparency in the Semiconducting State, Macromolecules, 2002, vol. 35:7281-7286.

A. Feiring et. al., J. Aromatic Monomers With Pendant Fluoroalkylsulfonate and Sulfonimide Groups, Journal of Fluorine Chemistry, 2000, vol. 105:129-135.

A. Feiring et. al., Novel Aromatic Polymers With Pendant Lithium Perfluoroalkylsulfonate or Sulfonimide Groups. Macromolecules, 2000, vol. 33:9262-9271.

D.D. Desmarteau, Novel Perfluorinated Ionomers and Ionenes, J. Fluorine Chem., 1995, vol. 72:203-208.

A.J. Appleby et. al., Polymeric Perfluoro Bis-Sulfonimides as Possible Fuel Cell Electrolytes, J. Electrochem. Soc, 1993, vol. 140:109-111.

G. Gustafsson et. al., Flexible Light-Emitting Diodes Made From Soluble Conducting Polymers, Nature, 1992, vol. 357-:477-479.

Y. Yang, Photoconductive Polymers, Kirk-Othmer Encyclopedia of Chemical Technology, Fourth Edition, 1996,vol. 18:837-860.

CRC Handbook of Chemistry and Physics, $81^{ST}$ Edition, 2000 (Book Not Included).

PCT/US 06/25012 Written Opinion of the International Searching Authority, Oct. 26, 2007, E. I. du Pont de Nemours and Company.

WO 2007/002681 A3 Later Publication with International Search Report, Jan. 4, 2007, E. I. du Pont de Nemours and Company.

* cited by examiner

ELECTRICALLY CONDUCTIVE POLYMER COMPOSITIONS

RELATED U.S. APPLICATIONS

This application claims priority from U.S. provisional application Ser. No. 60/694,278, dated Jun. 27, 2005.

BACKGROUND INFORMATION

1. Field of the Disclosure

This disclosure relates in general to electrically conductive polymer compositions and their uses in organic electronic devices.

2. Description of the Related Art

Organic electronic devices define a category of products that include an active layer. Such devices convert electrical energy into radiation, detect signals through electronic processes, convert radiation into electrical energy, or include one or more organic semiconductor layers.

Organic light-emitting diodes (OLEDs) are organic electronic devices comprising an organic layer capable of electroluminescence. OLEDs containing conducting polymers can have the following configuration:

anode/buffer layer/EL material/cathode

The anode is typically any material that has the ability to inject holes into the EL material, such as, for example, indium/tin oxide (ITO). The anode is optionally supported on a glass or plastic substrate. EL materials include fluorescent compounds, fluorescent and phosphorescent metal complexes, conjugated polymers, and mixtures or combinations thereof. The cathode is typically any material (such as, e.g., Ca or Ba) that has the ability to inject electrons into the EL material.

The buffer layer is typically an electrically conducting polymer and facilitates the injection of holes from the anode into the EL material layer. Typical conducting polymers employed as buffer layers include polyaniline and polydioxythiophenes such as poly(3,4-ethylenedioxythiophene) (PEDT). These materials can be prepared by polymerizing aniline or dioxythiophene monomers in aqueous solution in the presence of a water soluble polymeric acid, such as poly(styrenesulfonic acid) (PSS), as described in, for example, U.S. Pat. No. 5,300,575.

The aqueous electrically conductive polymer dispersions synthesized with water soluble polymeric sulfonic acids, however, have undesirably low pH levels. Low pH can contribute to decreased stress life of an EL device containing such a buffer layer, and contribute to corrosion within the device. Accordingly, there is a need for compositions and layers prepared therefrom having improved properties.

Electrically conducting polymers which have the ability to carry a high current when subjected to a low electrical voltage also have utility as electrodes for electronic devices, such as thin film field effect transistors. In such transistors, an organic semiconducting film that has high mobility for electron and/or hole charge carriers is present between source and drain electrodes. A gate electrode is on the opposite side of the semiconducting polymer layer. To be useful for the electrode application, the electrically conducting polymers and the liquids for dispersing or dissolving the electrically conducting polymers have to be compatible with the semiconducting polymers and the solvents for the semiconducting polymers to avoid re-dissolution of either conducting polymers or semiconducting polymers. Many conductive polymers have conductivities that are too low for use as electrodes. Accordingly, there is a need for improved conductive polymers.

Thus, there is a continuing need for electrically conductive polymer compositions having improved chemical, physical and electrical properties.

SUMMARY

There is provided an electrically conductive polymer composition comprising an electrically conductive copolymer and a fluorinated acid polymer.

In another embodiment, there is provided an aqueous dispersion of an electrically conductive copolymer and a fluorinated acid polymer.

In another embodiment, there is provided a method for producing an electrically conductive polymer composition, said method comprising forming a combination of water, at least two precursor monomers, at least one fluorinated acid polymer, and an oxidizing agent, in any order, provided that at least a portion of the fluorinated acid polymer is present when the conductive monomers are added or when the oxidizing agent is added.

In another embodiment, electronic devices comprising at least one layer comprising the new conductive polymer composition are provided.

BRIEF DESCRIPTION OF THE DRAWINGS

The invention is illustrated by way of example and not limitation in the accompanying figures.

Figure 1:
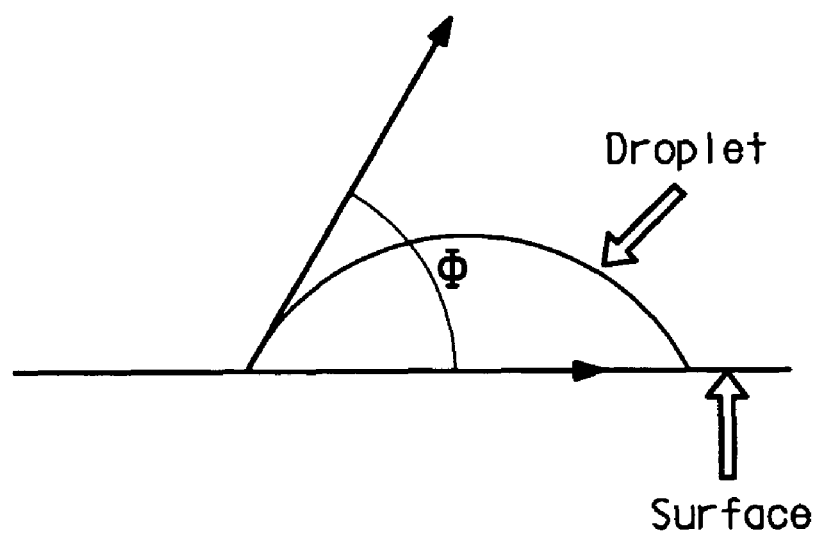
FIG. 1 is a diagram illustrating contact angle.

Skilled artisans appreciate that objects in the figures are illustrated for simplicity and clarity and have not necessarily been drawn to scale. For example, the dimensions of some of the objects in the figures may be magnified relative to other objects to help to improve understanding of embodiments.

DETAILED DESCRIPTION

In one embodiment, there is provided an electrically conductive polymer composition comprising an electrically conductive copolymer and a fluorinated acid polymer.

Many aspects and embodiments are described herein and are exemplary and not limiting. After reading this specification, skilled artisans will appreciate that other aspects and embodiments are possible without departing from the scope of the disclosure and appended claims.

As used herein, the term "copolymer" refers to a polymer or oligomer made from two or more different monomers. The term "two or more different monomers" refers to two or more separate monomers that can be polymerized together directly, and to two or more different monomers that are reacted to form a single intermediate monomer, and then polymerized. Monomers are considered different if, by way of example comparing two monomers, they have different structural repeat units or have the same structural repeat unit with different substituents on each. The term "electrically conductive" refers to a material that is inherently or intrinsically capable of electrical conductivity without the addition of carbon black or conductive metal particles. In some embodiments, the electrically conductive copolymer is conductive in a protonated form and not conductive in an unprotonated form. The term "fluorinated acid polymer" refers to a polymer having acidic groups, where at least some of the hydrogens have been replaced by fluorine. The term "acidic group"

refers to a group capable of ionizing to donate a hydrogen ion to a base to form a salt. The composition may comprise one or more different conductive copolymers and one or more different fluorinated acid polymers.

Any electrically conductive copolymer can be used in the new composition. In one embodiment, the electrically conductive copolymer will form a film having a conductivity of at least $10^{-7}$ S/cm.

The conductive copolymers suitable for the new composition are made from at least one monomer which, when polymerized alone, forms an electrically conductive homopolymer. Such monomers are referred to herein as "conductive precursor monomers." Monomers which, when polymerized alone form homopolymers which are not electrically conductive, are referred to as "non-conductive precursor monomers." The conductive copolymers suitable for the new composition can be made from two or more conductive precursor monomers or from a combination of one or more conductive precursor monomers and one or more non-conductive precursor monomers.

1. Conductive Precursor Monomers

In one embodiment, the conductive copolymer is made from at least one conductive precursor monomer selected from thiophenes, pyrroles, anilines, and polycyclic aromatics. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring.

In one embodiment, thiophene monomers contemplated for use to form the electrically conductive copolymer in the new composition comprise Formula I below:

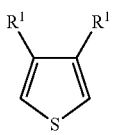

(I)

wherein:

$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:

"alcohol" —$R^3$—OH
"amido" —$R^3$—C(O)N($R^6$)$R^6$
"amidosulfonate" —$R^3$—C(O)N($R^6$)$R^4$—SO$_3$Z
"benzyl" —CH$_2$—C$_6$H$_5$
"carboxylate" —$R^3$—C(O)O—Z or —$R^3$—O—C(O)—Z
"ether" —$R^3$—(O—$R^5$)$_p$—O—$R^5$
"ether carboxylate" —$R^3$—O—$R^4$—C(O)O—Z or —$R^3$—O—$R^4$—O—C(O)—Z
"ether sulfonate" —$R^3$—O—$R^4$—SO$_3$Z
"ester sulfonate" —$R^3$—O—C(O)—$R^4$—SO$_3$Z
"sulfonimide" —$R^3$—SO$_2$—NH—SO$_2$—$R^5$
"urethane" —$R^3$—O—C(O)—N($R^6$)$_2$ where all "R" groups are the same or different at each occurrence and:
$R^3$ is a single bond or an alkylene group
$R^4$ is an alkylene group
$R^5$ is an alkyl group
$R^6$ is hydrogen or an alkyl group
p is 0 or an integer from 1 to 20
Z is H, alkali metal, alkaline earth metal, N($R^5$)$_4$ or $R^5$ Any of the above groups may further be unsubstituted or substituted, and any group may have F substituted for one or more hydrogens, including perfluorinated groups. In one embodiment, the alkyl and alkylene groups have from 1-20 carbon atoms.

In one embodiment, in the thiophene monomer, both $R^1$ together form —O—(CHY)$_m$—O—, where m is 2 or 3, and Y is the same or different at each occurrence and is selected from hydrogen, halogen, alkyl, alcohol, amidosulfonate, benzyl, carboxylate, ether, ether carboxylate, ether sulfonate, ester sulfonate, and urethane, where the Y groups may be partially or fully fluorinated. In one embodiment, all Y are hydrogen. In one embodiment, the polythiophene is poly(3,4-ethylenedioxythiophene). In one embodiment, at least one Y group is not hydrogen. In one embodiment, at least one Y group is a substituent having F substituted for at least one hydrogen. In one embodiment, at least one Y group is perfluorinated.

In one embodiment, the thiophene monomer has Formula Ia:

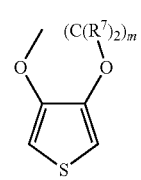

(Ia)

wherein:

$R^7$ is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^7$ is not hydrogen, and m is 2 or 3.

In one embodiment of Formula I(a), m is two, one $R^7$ is an alkyl group of more than 5 carbon atoms, and all other $R^7$ are hydrogen. In one embodiment of Formula I(a), at least one $R^7$ group is fluorinated. In one embodiment, at least one $R^7$ group has at least one fluorine substituent. In one embodiment, the $R^7$ group is fully fluorinated.

In one embodiment of Formula I(a), the $R^7$ substituents on the fused alicyclic ring on the thiophene offer improved solubility of the monomers in water and facilitate polymerization in the presence of the fluorinated acid polymer.

In one embodiment of Formula I(a), m is 2, one $R^7$ is sulfonic acid-propylene-ether-methylene and all other $R^7$ are hydrogen. In one embodiment, m is 2, one $R^7$ is propyl-ether-ethylene and all other $R^7$ are hydrogen. In one embodiment, m is 2, one $R^7$ is methoxy and all other $R^7$ are hydrogen. In one embodiment, one $R^7$ is sulfonic acid difluoromethylene ester methylene ($-CH_2-O-C(O)-CF_2-SO_3H$), and all other $R^7$ are hydrogen.

In one embodiment, pyrrole monomers contemplated for use to form the copolymer in the new composition comprise Formula II below.

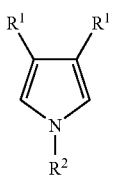

(II)

Where, in Formula II:

$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and $R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

In one embodiment, $R^1$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, ester sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In one embodiment, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In one embodiment, the pyrrole monomer is unsubstituted and both $R^1$ and $R^2$ are hydrogen.

In one embodiment, both $R^1$ together form a 6- or 7-membered alicyclic ring, which is further substituted with a group selected from alkyl, heteroalkyl, alcohol, benzyl, carboxylate, ether, ether carboxylate, ether sulfonate, ester sulfonate, and urethane. These groups can improve the solubility of the monomer and the resulting polymer. In one embodiment, both $R^1$ together form a 6- or 7-membered alicyclic ring, which is further substituted with an alkyl group. In one embodiment, both $R^1$ together form a 6- or 7-membered alicyclic ring, which is further substituted with an alkyl group having at least 1 carbon atom.

In one embodiment, both $R^1$ together form $-O-(CHY)_m-O-$, where m is 2 or 3, and Y is the same or different at each occurrence and is selected from hydrogen, alkyl, alcohol, benzyl, carboxylate, amidosulfonate, ether, ether carboxylate, ether sulfonate, ester sulfonate, and urethane. In one embodiment, at least one Y group is not hydrogen. In one embodiment, at least one Y group is a substituent having F substituted for at least one hydrogen. In one embodiment, at least one Y group is perfluorinated.

In one embodiment, aniline monomers contemplated for use to form the copolymer in the new composition comprise Formula III below.

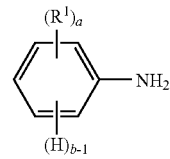

(III)

wherein:

a is 0 or an integer from 1 to 4;

b is an integer from 1 to 5, with the proviso that a+b=5; and $R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

When polymerized, the aniline monomeric unit can have Formula IV(a) or Formula IV(b) shown below, or a combination of both formulae.

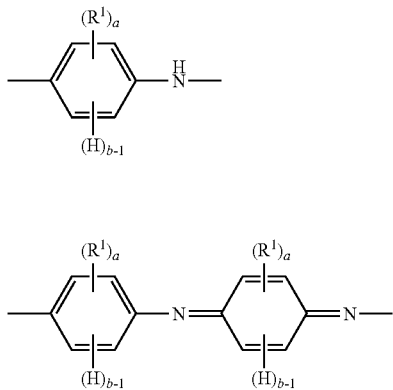

where a, b and $R^1$ are as defined above.

In one embodiment, the aniline monomer is unsubstituted and a=0.

In one embodiment, a is not 0 and at least one $R^1$ is fluorinated. In one embodiment, at least one $R^1$ is perfluorinated.

In one embodiment, fused polycylic heteroaromatic monomers contemplated for use to form copolymers in the new composition have two or more fused aromatic rings, at least one of which is heteroaromatic. In one embodiment, the fused polycyclic heteroaromatic monomer has Formula V:

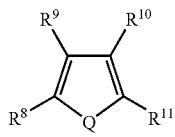

wherein:

Q is S or $NR^6$;

$R^6$ is hydrogen or alkyl;

$R^8$, $R^9$, $R^{10}$, and $R^{11}$ are independently selected so as to be the same or different at each occurrence and are selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; and at least one of $R^8$ and $R^9$, $R^9$ and $R^{10}$, and $R^{10}$ and $R^{11}$ together form an alkenylene chain completing a 5 or 6-membered aromatic ring, which ring may optionally include one or more divalent nitrogen, sulfur or oxygen atoms.

In one embodiment, the fused polycyclic heteroaromatic monomer has Formula V(a), V(b), V(c), V(d), V(e), V(f), and V(g):

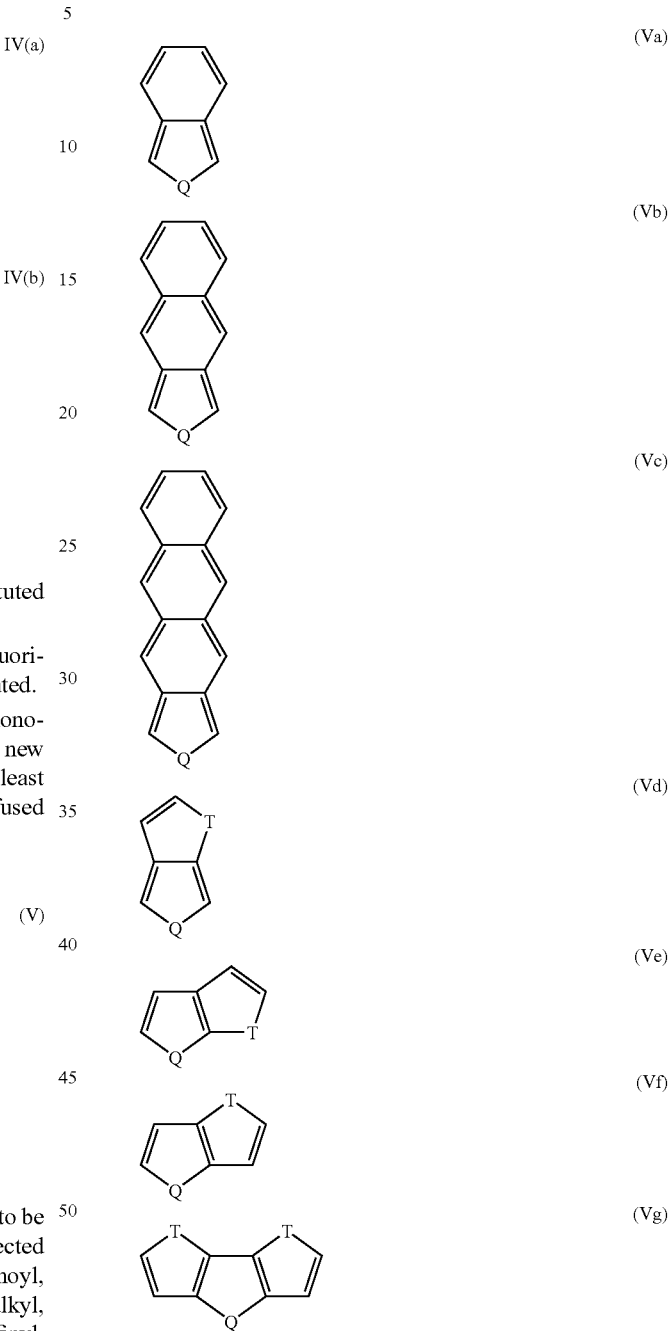

wherein:

Q is S or NH; and

T is the same or different at each occurrence and is selected from S, $NR^6$, O, $SiR^6_2$, Se, and $PR^6$;

$R^6$ is hydrogen or alkyl.

The fused polycyclic heteroaromatic monomers may be further substituted with groups selected from alkyl, heteroalkyl, alcohol, benzyl, carboxylate, ether, ether carboxylate, ether sulfonate, ester sulfonate, and urethane. In one embodiment, the substituent groups are fluorinated. In one embodiment, the substituent groups are fully fluorinated.

In one embodiment, the fused polycyclic heteroaromatic monomer is a thieno(thiophene). Such compounds have been discussed in, for example, Macromolecules, 34, 5746-5747 (2001); and Macromolecules, 35, 7281-7286 (2002). In one embodiment, the thieno(thiophene) is selected from thieno(2,3-b)thiophene, thieno(3,2-b)thiophene, and thieno(3,4-b)thiophene. In one embodiment, the thieno(thiophene) monomer is substituted with at least one group selected from alkyl, heteroalkyl, alcohol, benzyl, carboxylate, ether, ether carboxylate, ether sulfonate, ester sulfonate, and urethane. In one embodiment, the substituent groups are fluorinated. In one embodiment, the substituent groups are fully fluorinated.

In one embodiment, polycyclic heteroaromatic monomers contemplated for use to form the copolymer in the new composition comprise Formula VI:

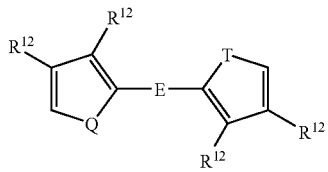

wherein:
Q is S or $NR^6$;
T is selected from S, $NR^6$, O, $SiR^6_2$, Se, and $PR^6$;
E is selected from alkenylene, arylene, and heteroarylene;
$R^6$ is hydrogen or alkyl;
$R^{12}$ is the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; or two $R^{12}$ groups together may form an alkylene or alkenylene chain completing a 3, 4, 5, 6, or 7-membered aromatic or alicyclic ring, which ring may optionally include one or more divalent nitrogen, sulfur or oxygen atoms.

In one embodiment, the electrically conductive copolymer is a copolymer of two or more conductive precursor monomers. In one embodiment, the conductive precursor monomers are selected from thiophenes, pyrroles, anilines, and polycyclic aromatics. In one embodiment, the electrically conductive copolymer is formed by oxidative polymerization of two or more conductive precursor monomers.

2. Non-conductive Precursor Monomers

In one embodiment, the electrically conductive copolymer is a copolymer of at least one conductive precursor monomer and at least one non-conductive precursor monomer. Any type of non-conductive precursor monomer can be used, so long as it does not detrimentally affect the desired properties of the copolymer. In one embodiment, the non-conductive precursor monomer comprises no more than 50% of the copolymer, based on the total number of monomer units. In one embodiment, the non-conductive precursor monomer comprises no more than 30%, based on the total number of monomer units. In one embodiment, the non-conductive precursor monomer comprises no more than 10%, based on the total number of monomer units.

Exemplary types of non-conductive precursor monomers include, but are not limited to, alkenyl, alkynyl, arylene, and heteroarylene. Examples of non-conductive monomers include, but are not limited to, fluorene, oxadiazole, thiadiazole, benzothiadiazole, phenylenevinylene, phenyleneethynylene, pyridine, diazines, and triazines, all of which may be further substituted.

In one embodiment, the copolymers are made by first forming an intermediate precursor monomer having the structure A-B-C, where A and C represent conductive precursor monomers, which can be the same or different, and B represents a non-conductive precursor monomer. The A-B-C intermediate precursor monomer can be prepared using standard synthetic organic techniques, such as Yamamoto, Stille, Grignard metathesis, Suzuki, and Negishi couplings. The copolymer is then formed by oxidative polymerization of the intermediate precursor monomer alone, or with one or more additional conductive precursor monomers.

3. Fluorinated Acid Polymer

The fluorinated acid polymer can be any polymer which is fluorinated and has acidic groups with acidic protons. As used herein, the term "fluorinated" means that at least one hydrogen bonded to a carbon has been replaced with a fluorine. The term includes partially and fully fluorinated materials. In one embodiment, the fluorinated acid polymer is highly fluorinated. The term "highly fluorinated" means that at least 50% of the available hydrogens bonded to a carbon, have been replaced with fluorine. The acidic groups supply an ionizable proton. In one embodiment, the acidic proton has a pKa of less than 3. In one embodiment, the acidic proton has a pKa of less than 0. In one embodiment, the acidic proton has a pKa of less than −5. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group.

In one embodiment, the fluorinated acid polymer is water-soluble. In one embodiment, the fluorinated acid polymer is dispersible in water.

In one embodiment, the fluorinated acid polymer is organic solvent wettable. The term "organic solvent wettable" refers to a material which, when formed into a film, is wettable by organic solvents. The term also includes polymeric acids which are not film-forming alone, but which form an electrically conductive polymer composition which is wettable. In one embodiment, wettable materials form films which are wettable by phenylhexane with a contact angle no greater than 40°. As used herein, the term "contact angle" is intended to mean the angle Φ shown in FIG. 1. For a droplet of liquid medium, angle Φ is defined by the intersection of the plane of the surface and a line from the outer edge of the droplet to the surface. Furthermore, angle Φ is measured after the droplet has reached an equilibrium position on the surface after being applied, i.e., "static contact angle". The film of the organic solvent wettable fluorinated polymeric acid is represented as the surface. In one embodiment, the contact angle is no greater than 35°. In one embodiment, the contact angle is no greater than 30°. The methods for measuring contact angles are well known.

In one embodiment, the polymer backbone is fluorinated. Examples of suitable polymeric backbones include, but are not limited to, polyolefins, polyacrylates, polymethacrylates, polyimides, polyamides, polyaramids, polyacrylamides, polystyrenes, and copolymers thereof. In one embodiment, the polymer backbone is highly fluorinated. In one embodiment, the polymer backbone is fully fluorinated.

In one embodiment, the acidic groups are selected from sulfonic acid groups and sulfonimide groups. In one embodiment, the acidic groups are on a fluorinated side chain. In one embodiment, the fluorinated side chains are selected from alkyl groups, alkoxy groups, amido groups, ether groups, and combinations thereof.

In one embodiment, the fluorinated acid polymer has a fluorinated olefin backbone, with pendant fluorinated ether sulfonate, fluorinated ester sulfonate, or fluorinated ether sulfonimide groups. In one embodiment, the polymer is a copolymer of 1,1-difluoroethylene and 2-(1,1-difluoro-2-(trifluoromethyl)allyloxy)-1,1,2,2-tetrafluoroethanesulfonic acid. In one embodiment, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In one embodiment, the fluorinated acid polymer is homopolymer or copolymer of a fluorinated and partially sulfonated poly(arylene ether sulfone). The copolymer can be a block copolymer. Examples of comonomers include, but are not limited to butadiene, butylene, isobutylene, styrene, and combinations thereof.

In one embodiment, the fluroinated acid polymer is a homopolymer or copolymer of monomers having Formula VII:

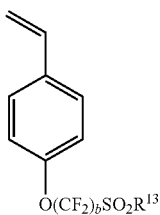

(VII)

O(CF$_2$)$_b$SO$_2$R$^{13}$ where:

b is an integer from 1 to 5,

R$^{13}$ is OH or NHR$^{14}$, and

R$^{14}$ is alkyl, fluoroalkyl, sulfonylalkyl, or sulfonylfluoroalkyl.

In one embodiment, the monomer is "SFS" or "SFSI" shown below:

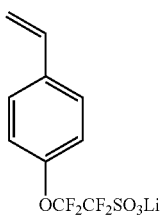

SFS

OCF$_2$CF$_2$SO$_3$Li

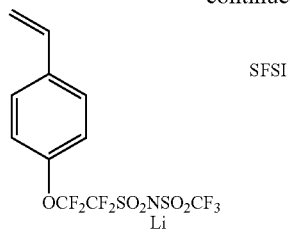

-continued

SFSI

OCF$_2$CF$_2$SO$_2$NSO$_2$CF$_3$
  Li

After polymerization, the polymer can be converted to the acid form.

In one embodiment, the fluorinated acid polymer is a homopolymer or copolymer of a trifluorostyrene having acidic groups. In one embodiment, the trifluorostyrene monomer has Formula VII:

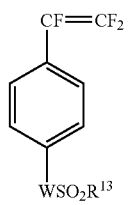

(VIII)

CF=CF$_2$

WSO$_2$R$^{13}$ where:

W is selected from (CF$_2$)$_q$, O(CF$_2$)$_q$, S(CF$_2$)$_q$, (CF$_2$)$_q$O (CF$_2$)$_r$, and SO$_2$ (CF$_2$)$_q$, b is independently an integer from 1 to 5, R$^{13}$ is OH or NHR$^{14}$, and R$^{14}$ is alkyl, fluoroalkyl, sulfonylalkyl, or sulfonylfluoroalkyl.

In one embodiment, the monomer containing W equal to S(CF$_2$)$_q$ is polymerized then oxidized to give the polymer containing W equal to SO$_2$(CF$_2$)$_q$. In one embodiment, the polymer containing R$^{13}$ equal to F is converted its acid form where R$^{13}$ is equal to OH or NHR$^{14}$.

In one embodiment, the fluorinated acid polymer is a sulfonimide polymer having Formula IX:

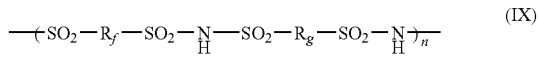

(IX)

where:

R$_f$ is selected from fluorinated alkylene, fluorinated heteroalkylene, fluorinated arylene, or fluorinated heteroarylene;

R$_g$ is selected from fluorinated alkylene, fluorinated heteroalkylene, fluorinated arylene, fluorinated heteroarylene, arylene, or heteroarylene; and n is at least 4.

In one embodiment of Formula IX, R$_f$ and R$_g$ are perfluoroalkylene groups. In one embodiment, R$_f$ and R$_g$ are perfluorobutylene groups. In one embodiment, R$_f$ and R$_g$ contain ether oxygens. In one embodiment, n is greater than 20.

In one embodiment, the fluorinated acid polymer comprises a fluorinated polymer backbone and a side chain having Formula X:

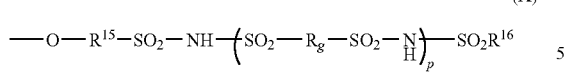

(X)

where:
R$^{15}$ is a fluorinated alkylene group or a fluorinated heteroalkylene group;
R$^{16}$ is a fluorinated alkyl or a fluorinated aryl group; and
a is 0 or an integer from 1 to 4.

In one embodiment, the fluorinated acid polymer has Formula XI:

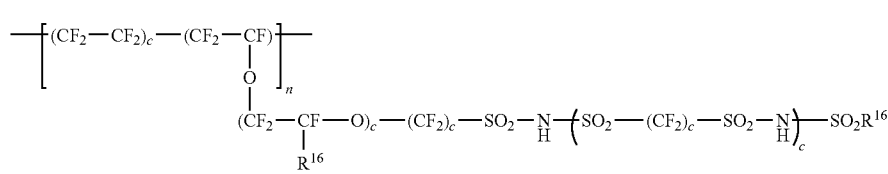

(XI)

where:
R$^{16}$ is a fluorinated alkyl or a fluorinated aryl group;
a, b, c, d, and e are each independently 0 or an integer from 1 to 4; and
n is at least 4.

The synthesis of fluorinated acid polymers has been described in, for example, A. Feiring et al., J. Fluorine Chemistry 2000, 105, 129-135; A. Feiring et al., Macromolecules 2000, 33, 9262-9271; D. D. Desmarteau, J. Fluorine Chem. 1995, 72, 203-208; A. J. Appleby et al., J. Electrochem. Soc. 1993, 140(1), 109-111; and Desmarteau, U.S. Pat. No. 5,463,005.

In one embodiment, the fluorinated acid polymer comprises at least one repeat unit derived from an ethylenically unsaturated compound having the structure (XII):

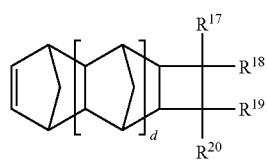

(XII)

wherein d is 0, 1, or 2;
R$^{17}$ to R$^{20}$ are independently H, halogen, alkyl or alkoxy of 1 to 10 carbon atoms, Y, C(R$_f'$)(R$_f'$)OR$^{21}$, R$^4$Y or OR$^4$Y;
Y is COE$^2$, SO$_2$ E$^2$, or sulfonimide;
R$^{21}$ is hydrogen or an acid-labile protecting group;
R$_f'$ is the same or different at each occurrence and is a fluoroalkyl group of 1 to 10 carbon atoms, or taken together are (CF$_2$)$_e$ where e is 2 to 10;
R$^4$ is an alkylene group;
E$^2$ is OH, halogen, or OR$^7$; and
R$^5$ is an alkyl group;
with the proviso that at least one of R$^{17}$ to R$^{20}$ is Y, R$^4$Y or OR$^4$Y.

R$^4$, R$^5$, and R$^{17}$ to R$^{20}$ may optionally be substituted by halogen or ether oxygen.

Some illustrative, but nonlimiting, examples of representative monomers of Formulas XIIa-XIIe within the scope of the invention are presented below:

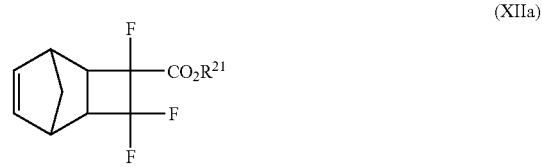

(XIIa)

-continued

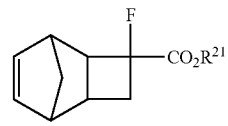

(XIIb)

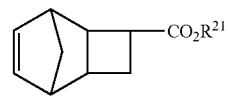

(XIIc)

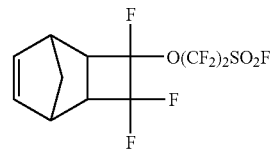

(XIId)

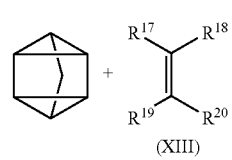

(XIIe)

wherein R$^{21}$ is a group capable of forming or rearranging to a tertiary cation, more typically an alkyl group of 1 to 20 carbon atoms, and most typically t-butyl.

Compounds of structure (XII) wherein d=0, structure (e.g, XIIa), may be prepared by cycloaddition reaction of unsaturated compounds of structure (XIII) with quadricyclane (tetracyclo[2.2.1.0$^{2,6}$O$^{3.5}$]heptane) as shown in the equation below.

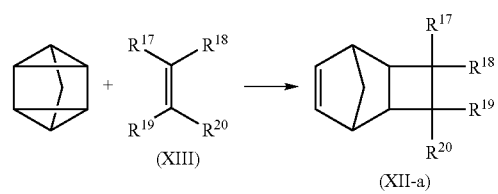

The reaction may be conducted at temperatures ranging from about 0° C. to about 200° C., more typically from about 30° C. to about 150° C. in the absence or presence of an inert solvent such as diethyl ether. For reactions conducted at or above the boiling point of one or more of the reagents or solvent, a closed reactor is typically used to avoid loss of volatile components. Compounds of Formula XII with higher values of d (i.e., d=1 or 2) may be prepared by reaction of compounds of Formula XII with d=0 with cyclopentadiene, as is known in the art.

In one embodiment, the fluorinated acid polymer also comprises a repeat unit derived from at least one ethylenically unsaturated compound containing at least one fluorine atom attached to an ethylenically unsaturated carbon. The fluoroolefin comprises 2 to 20 carbon atoms. Representative fluoroolefins include, but are not limited to, tetrafluoroethylene, hexafluoropropylene, chlorotrifluoroethylene, vinylidene fluoride, vinyl fluoride, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a saturated fluoroalkyl group of from 1 to about ten carbon atoms. In one embodiment, the comonomer is tetrafluoroethylene.

In one embodiment, the fluorinated acid polymer is a colloid-forming polymeric acid. As used herein, the term "colloid-forming" refers to materials which are insoluble in water, and form colloids when dispersed into an aqueous medium. The colloid-forming polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any colloid-forming polymeric material having acidic protons can be used. In one embodiment, the colloid-forming fluorinated polymeric acid has acidic groups selected from carboxylic groups, sulfonic acid groups, and sulfonimide groups. In one embodiment, the colloid-forming fluorinated polymeric acid is a polymeric sulfonic acid. In one embodiment, the colloid-forming polymeric sulfonic acid is perfluorinated. In one embodiment, the colloid-forming polymeric sulfonic acid is a perfluoroalkylenesulfonic acid.

In one embodiment, the fluorinated acid polymer comprises a polymeric backbone having pendant groups comprising siloxane sulfonic acid. In one embodiment, the siloxane pendant groups have the formula below:

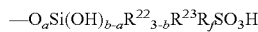

—$O_aSi(OH)_{b-a}R^{22}{}_{3-b}R^{23}R_fSO_3H$ wherein:
a is from 1 to b;
b is from 1 to 3;
$R^{22}$ is a non-hydrolyzable group independently selected from the group consisting of alkyl, aryl, and arylalkyl;
$R^{23}$ is a bidentate alkylene radical, which may be substituted by one or more ether oxygen atoms, with the proviso that $R^{23}$ has at least two carbon atoms linearly disposed between Si and $R_f$; and
$R_f$ is a perfluoroalkylene radical, which may be substituted by one or more ether oxygen atoms.

In one embodiment, the fluorinated acid polymer having pendant siloxane groups has a fluorinated backbone. In one embodiment, the backbone is perfluorinated.

In one embodiment, the fluorinated acid polymer has a fluorinated backbone and pendant groups represented by the Formula (XIV)

—$O_g$—[$CF(R_f^2)CF$—$O_h$]$_i$—$CF_2CF_2SO_3H$ (XIV)

wherein $R_f^2$ is F or a perfluoroalkyl radical having 1-10 carbon atoms either unsubstituted or substituted by one or more ether oxygen atoms, h=0 or 1, i=0 to 3, and g=0 or 1.

In one embodiment, the fluorinated acid polymer has formula (XV)

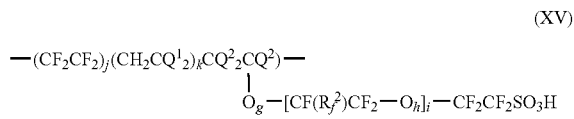

(XV)

—$(CF_2CF_2)_j(CH_2CQ^1{}_2)_kCQ^2{}_2CQ^2)$—
        |
        $O_g$—[$CF(R_f^2)CF_2$—$O_h$]$_i$—$CF_2CF_2SO_3H$ where j≧0, k≧0 and 4≦(j+k)≦199, $Q^1$ and $Q^2$ are F or H, $R_f^2$ is F or a perfluoroalkyl radical having 1-10 carbon atoms either unsubstituted or substituted by one or more ether oxygen atoms, h=0 or 1, i=0 to 3, g=0 or 1, and $E^4$ is H or an alkali metal. In one embodiment $R_f^2$ is —$CF_3$, g=1, h=1, and i=1. In one embodiment the pendant group is present at a concentration of 3-10 mol-%.

In one embodiment, $Q^1$ is H, k≧0, and $Q^2$ is F, which may be synthesized according to the teachings of Connolly et al., U.S. Pat. No. 3,282,875. In another preferred embodiment, $Q^1$ is H, $Q^2$ is H, g=0, $R_f^2$ is F, h=1, and i=1, which may be synthesized according to co-pending provisional application Ser. No. 60/105,662. Still other embodiments may be synthesized according to the various teachings in Drysdale et al., WO 9831716(A1), and co-pending U.S. applications Choi et al, WO 99/52954(A1), and 60/176,881.

In one embodiment, the colloid-forming polymeric acid is a highly-fluorinated sulfonic acid polymer ("FSA polymer"). "Highly fluorinated" means that at least about 50% of the total number of halogen and hydrogen atoms in the polymer are fluorine atoms, an in one embodiment at least about 75%, and in another embodiment at least about 90%. In one embodiment, the polymer is perfluorinated. The term "sulfonate functional group" refers to either to sulfonic acid groups or salts of sulfonic acid groups, and in one embodiment alkali metal or ammonium salts. The functional group is represented by the formula —$SO_3E^5$ where $E^5$ is a cation, also known as a "counterion". $E^5$ may be H, Li, Na, K or $N(R_1)(R_2)(R_3)(R_4)$, and $R_1$, $R_2$, $R_3$, and $R_4$ are the same or different and are and in one embodiment H, $CH_3$ or $C_2H_5$. In another embodiment, $E^5$ is H, in which case the polymer is said to be in the "acid form". $E^5$ may also be multivalent, as represented by such ions as $Ca^{++}$, and $Al^{+++}$. It is clear to the skilled artisan that in the case of multivalent counterions, represented generally as $M^{x+}$, the number of sulfonate functional groups per counterion will be equal to the valence "x".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying the cation exchange group or its precursor, e.g., a sulfonyl fluoride group (—$SO_2F$), which can be subsequently hydrolyzed to a sulfonate functional group. For example, copolymers of a first fluorinated vinyl monomer together with a second fluorinated vinyl monomer having a sulfonyl fluoride group (—$SO_2F$) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

In other embodiments, possible second monomers include fluorinated vinyl ethers with sulfonate functional groups or precursor groups which can provide the desired side chain in the polymer. Additional monomers, including ethylene, propylene, and R—CH=CH$_2$ where R is a perfluorinated alkyl group of 1 to 10 carbon atoms, can be incorporated into these polymers if desired. The polymers may be of the type referred to herein as random copolymers, that is, copolymers made by polymerization in which the relative concentrations of the comonomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as those disclosed in European Patent Application No. 1 026 152 A1, may also be used.

In one embodiment, FSA polymers for use in the present invention include a highly fluorinated, and in one embodiment perfluorinated, carbon backbone and side chains represented by the formula

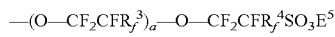

wherein $R_f^3$ and $R_f^4$ are independently selected from F, Cl or a perfluorinated alkyl group having 1 to 10 carbon atoms, a=0, 1 or 2, and $E^5$ is H, Li, Na, K or N(R1)(R2)(R3)(R4) and R1, R2, R3, and R4 are the same or different and are and in one embodiment H, CH$_3$ or C$_2$H$_5$. In another embodiment $E^5$ is H. As stated above, $E^5$ may also be multivalent.

In one embodiment, the FSA polymers include, for example, polymers disclosed in U.S. Pat. No. 3,282,875 and in U.S. Pat. Nos. 4,358,545 and 4,940,525. An example of a preferred FSA polymer comprises a perfluorocarbon backbone and the side chain represented by the formula

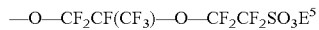

where X is as defined above. FSA polymers of this type are disclosed in U.S. Pat. No. 3,282,875 and can be made by copolymerization of tetrafluoroethylene (TFE) and the perfluorinated vinyl ether CF$_2$=CF—O—CF$_2$CF(CF$_3$)—O—CF$_2$CF$_2$SO$_2$F, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—CF$_2$CF$_2$SO$_3$E$^5$, wherein $E^5$ is as defined above. This polymer can be made by copolymerization of tetrafluoroethylene (TFE) and the perfluorinated vinyl ether CF$_2$=CF—O—CF$_2$CF$_2$SO$_2$F, perfluoro(3-oxa-4-pentenesulfonyl fluoride) (POPF), followed by hydrolysis and further ion exchange as necessary.

In one embodiment, the FSA polymers for use in this invention typically have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is —O—CF$_2$—CF(CF$_3$)—O—CF$_2$—CF$_2$—SO$_3$H (or a salt thereof), the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain —O—CF$_2$CF$_2$SO$_3$H (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The FSA polymers can be prepared as colloidal aqueous dispersions. They may also be in the form of dispersions in other media, examples of which include, but are not limited to, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 disclose methods for making of aqueous alcoholic dispersions. After the dispersion is made, concentration and the dispersing liquid composition can be adjusted by methods known in the art.

Aqueous dispersions of the colloid-forming polymeric acids, including FSA polymers, typically have particle sizes as small as possible and an EW as small as possible, so long as a stable colloid is formed.

Aqueous dispersions of FSA polymer are available commericially as Nafion® dispersions, from E. I. du Pont de Nemours and Company (Wilmington, Del.).

4. Preparation of Conductive Compositions

The new electrically conductive copolymer composition is prepared by (i) polymerizing the precursor monomers in the presence of the fluorinated acid polymer; or (ii) first forming the electrically conductive copolymer and combining it with the fluorinated acid polymer.

(i) Polymerizing Precursor Monomers in the Presence of the Fluorinated Acid Polymer In one embodiment, the electrically conductive copolymer composition is formed by the oxidative polymerization of the precursor monomers in the presence of the fluorinated acid polymer. In one embodiment, the precursor monomers comprise two or more conductive precursor monomers. In one embodiment, the precursor monomers comprise one or more interemediate precursor monomers. In one embodiment, the precursor monomers comprise one or more conductive precursor monomers and one or more intermediate precursor monomers.

In one embodiment, the oxidative polymerization is carried out in a homogeneous aqueous solution. In another embodiment, the oxidative polymerization is carried out in an emulsion of water and an organic solvent. In general, some water is present in order to obtain adequate solubility of the oxidizing agent and/or catalyst. Oxidizing agents such as ammonium persulfate, sodium persulfate, potassium persulfate, and the like, can be used. A catalyst, such as ferric chloride, or ferric sulfate may also be present. The resulting polymerized product will be a solution, dispersion, or emulsion of the conductive copolymer in association with the fluorinated acid polymer. In one embodiment, the electrically conductive copolymer is positively charged, and the charges are balanced by the fluorinated acid polymer anion.

In one embodiment, the method of making an aqueous dispersion of the new conductive copolymer composition includes forming a reaction mixture by combining water, at least two precursor monomers, at least one fluorinated acid polymer, and an oxidizing agent, in any order, provided that at least a portion of the fluorinated acid polymer is present when at least one of the precursor monomers and the oxidizing agent is added.

In one embodiment, the method of making the new conductive copolymer composition comprises:
(a) providing an aqueous solution or dispersion of a fluorinated acid polymer;
(b) adding an oxidizer to the solutions or dispersion of step (a); and
(c) adding at least two precursor monomers to the mixture of step (b).

In another embodiment, the precursor monomers are added to the aqueous solution or dispersion of the fluorinated acid polymer prior to adding the oxidizer. Step (b) above, which is adding oxidizing agent, is then carried out.

In another embodiment, a mixture of water and the precursor monomers is formed, in a concentration typically in the range of about 0.5% by weight to about 4.0% by weight total precursor monomer. This precursor monomer mixture is added to the aqueous solution or dispersion of the fluorinated acid polymer, and steps (b) above which is adding oxidizing agent is carried out.

In another embodiment, the aqueous polymerization mixture may include a polymerization catalyst, such as ferric sulfate, ferric chloride, and the like. The catalyst is added before the last step. In another embodiment, a catalyst is added together with an oxidizing agent.

In one embodiment, the polymerization is carried out in the presence of co-dispersing liquids which are miscible with water. Examples of suitable co-dispersing liquids include, but are not limited to ethers, alcohols, alcohol ethers, cyclic ethers, ketones, nitrites, sulfoxides, amides, and combinations thereof. In one embodiment, the co-dispersing liquid is an alcohol. In one embodiment, the co-dispersing liquid is an organic solvent selected from n-propanol, isopropanol, t-butanol, dimethylacetamide, dimethylformamide, N-methylpyrrolidone, and mixtures thereof. In general, the amount of co-dispersing liquid should be less than about 60% by volume. In one embodiment, the amount of co-dispersing liquid is less than about 30% by volume. In one embodiment, the amount of co-dispersing liquid is between 5 and 50% by volume. The use of a co-dispersing liquid in the polymerization significantly reduces particle size and improves filterability of the dispersions. In addition, buffer materials obtained by this process show an increased viscosity and films prepared from these dispersions are of high quality.

The co-dispersing liquid can be added to the reaction mixture at any point in the process.

In one embodiment, the polymerization is carried out in the presence of a co-acid which is a Brønsted acid. The acid can be an inorganic acid, such as HCl, sulfuric acid, and the like, or an organic acid, such as acetic acid or p-toluenesulfonic acid. Alternatively, the acid can be a water soluble polymeric acid such as poly(styrenesulfonic acid), poly(2-acrylamido-2-methyl-1-propanesulfonic acid, or the like, or a second fluorinated acid polymer, as described above. Combinations of acids can be used.

The co-acid can be added to the reaction mixture at any point in the process prior to the addition of either the oxidizer or the precursor monomer, whichever is added last. In one embodiment, the co-acid is added before both the precursor monomers and the fluorinated acid polymer, and the oxidizer is added last. In one embodiment the co-acid is added prior to the addition of the precursor monomers, followed by the addition of the fluorinated acid polymer, and the oxidizer is added last. In one embodiment, the polymerization is carried out in the presence of both a co-dispersing liquid and a co-acid.

In one embodiment, a reaction vessel is charged first with a mixture of water, alcohol co-dispersing agent, and inorganic co-acid. To this is added, in order, the precursor monomers, an aqueous solution or dispersion of fluorinated acid polymer, and an oxidizer. The oxidizer is added slowly and dropwise to prevent the formation of localized areas of high ion concentration which can destabilize the mixture. In another embodiment, the oxidizer and precursor monomers are injected into the reaction mixture separately and simultaneously at a controlled rate. The mixture is stirred and the reaction is then allowed to proceed at a controlled temperature. When polymerization is completed, the reaction mixture is treated with a strong acid cation resin, stirred and filtered; and then treated with a base anion exchange resin, stirred and filtered. Alternative orders of addition can be used, as discussed above.

In the method of making the new conductive polymer composition, the molar ratio of oxidizer to total precursor monomer is generally in the range of 0.1 to 3.0; and in one embodiment is 0.4 to 1.5. The molar ratio of fluorinated acid polymer to total precursor monomer is generally in the range of 0.2 to 10. In one embodiment, the ratio is in the range of 1 to 5. The overall solid content is generally in the range of about 0.5% to 12% in weight percentage; and in one embodiment of about 2% to 6%. The reaction temperature is generally in the range of about 4° C. to 50° C.; in one embodiment about 20° C. to 35° C. The molar ratio of optional co-acid to precursor monomer is about 0.05 to 4. The addition time of the oxidizer influences particle size and viscosity. Thus, the particle size can be reduced by slowing down the addition speed. In parallel, the viscosity is increased by slowing down the addition speed. The reaction time is generally in the range of about 1 to about 30 hours.

(ii) Combining Electrically Conductive Copolymers with Fluorinated Acid Polymers In one embodiment, the electrically conductive copolymers are formed separately from the fluorinated acid polymer. In one embodiment, the copolymers are prepared by oxidatively polymerizing the corresponding monomers in aqueous solution. In one embodiment, the oxidative polymerization is carried out in the presence of a water soluble acid. In one embodiment, the acid is a water-soluble non-fluorinated polymeric acid. In one embodiment, the acid is a non-fluorinated polymeric sulfonic acid. Some non-limiting examples of the acids are poly(styrenesulfonic acid) ("PSSA"), poly(2-acrylamido-2-methyl-1-propanesulfonic acid) ("PAAMPSA"), and mixtures thereof. Where the oxidative polymerization results in a copolymer that has positive charge, the acid anion provides the counterion for the conductive copolymer. The oxidative polymerization is carried out using an oxidizing agent such as ammonium persulfate, sodium persulfate, and mixtures thereof.

The new electrically conductive polymer composition is prepared by blending the electrically conductive copolymer with the fluorinated acid polymer. This can be accomplished by adding an aqueous dispersion of the electrically conductive copolymer to a dispersion or solution of the polymeric acid. In one embodiment, the composition is further treated using sonication or microfluidization to ensure mixing of the components.

In one embodiment, one or both of the electrically conductive copolymer and fluorinated acid polymer are isolated in solid form. The solid material can be redispersed in water or in an aqueous solution or dispersion of the other component. For example, electrically conductive copolymer solids can be dispersed in an aqueous solution or dispersion of a fluorinated acid polymer.

(iii) pH Adjustment

As synthesized, the aqueous dispersions of the new conductive copolymer composition generally have a very low pH. In one embodiment, the pH is adjusted to higher values, without adversely affecting the properties in devices. In one embodiment, the pH of the dispersion is adjusted to about 1.5 to about 4. In one embodiment, the pH is adjusted to between 3 and 4. It has been found that the pH can be adjusted using known techniques, for example, ion exchange or by titration with an aqueous basic solution.

In one embodiment, after completion of the polymerization reaction, the as-synthesized aqueous dispersion is contacted with at least one ion exchange resin under conditions suitable to remove decomposed species, side reaction products, and unreacted monomers, and to adjust pH, thus producing a stable, aqueous dispersion with a desired pH. In one embodiment, the as-synthesized aqueous dispersion is contacted with a first ion exchange resin and a second ion exchange resin, in any order. The as-synthesized aqueous dispersion can be treated with both the first and second ion exchange resins simultaneously, or it can be treated sequentially with one and then the other.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as cation exchangers or anion exchangers. Cation exchangers have positively charged mobile ions available for exchange, typically protons or metal ions such as sodium ions. Anion exchangers have exchangeable ions which are negatively charged, typically hydroxide ions.

In one embodiment, the first ion exchange resin is a cation, acid exchange resin which can be in protonic or metal ion, typically sodium ion, form. The second ion exchange resin is a basic, anion exchange resin. Both acidic, cation including proton exchange resins and basic, anion exchange resins are contemplated for use in the practice of the invention. In one embodiment, the acidic, cation exchange resin is an inorganic acid, cation exchange resin, such as a sulfonic acid cation exchange resin. Sulfonic acid cation exchange resins contemplated for use in the practice of the invention include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphorous cation exchange resin. In addition, mixtures of different cation exchange resins can be used.

In another embodiment, the basic, anionic exchange resin is a tertiary amine anion exchange resin. Tertiary amine anion exchange resins contemplated for use in the practice of the invention include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the as-synthesized aqueous dispersion either simultaneously, or consecutively. For example, in one embodiment both resins are added simultaneously to an as-synthesized aqueous dispersion of an electrically conducting copolymer, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. Without wishing to be bound by theory, it is believed that the ion exchange resins quench polymerization and effectively remove ionic and non-ionic impurities and most of unreacted monomer from the as-synthesized aqueous dispersion. Moreover, the basic, anion exchange and/or acidic, cation exchange resins renders the acidic sites more basic, resulting in increased pH of the dispersion. In general, about one to five grams of ion exchange resin is used per gram of new conductive copolymer composition.

In many cases, the basic ion exchange resin can be used to adjust the pH to the desired level. In some cases, the pH can be further adjusted with an aqueous basic solution such as a solution of sodium hydroxide, ammonium hydroxide, tetramethylammonium hydroxide, or the like.

In another embodiment, more conductive dispersions are formed by the addition of highly conductive additives to the aqueous dispersions of the new conductive copolymer composition. Because dispersions with relatively high pH can be formed, the conductive additives, especially metal additives, are not attacked by the acid in the dispersion. Examples of suitable conductive additives include, but are not limited to metal particles and nanoparticles, nanowires, carbon nanotubes, graphite fibers or particles, carbon particles, and combinations thereof.

5. Buffer Layers

In another embodiment of the invention, there are provided buffer layers deposited from aqueous dispersions comprising the new conductive polymer composition. The term "buffer layer" or "buffer material" are intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, inlcude but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The dried films of the new conductive copolymer composition are generally not redispersible in water. Thus the buffer layer can be applied as multiple thin layers. In addition, the buffer layer can be overcoated with a layer of different water-soluble or water-dispersible material without being damaged. Buffer layers comprising the new conductive copolymer composition have been surprisingly found to have improved wetability.

In another embodiment, there are provided buffer layers deposited from aqueous dispersions comprising the new conductive copolymer composition blended with other water soluble or dispersible materials. Examples of types of materials which can be added include, but are not limited to polymers, dyes, coating aids, organic and inorganic conductive inks and pastes, charge transport materials, crosslinking agents, and combinations thereof. The other water soluble or dispersible materials can be simple molecules or polymers. Examples of suitable polymers include, but are not limited to, conductive polymers such as polythiophenes, polyanilines, polypyrroles, polyacetylenes, and combinations thereof.

6. Electronic Devices

In another embodiment of the invention, there are provided electronic devices comprising at least one electroactive layer positioned between two electrical contact layers, wherein the device further includes the new buffer layer. The term "electroactive" when referring to a layer or material is intended to mean a layer or material that exhibits electronic or electro-radiative properties. An electroactive layer material may emit radiation or exhibit a change in concentration of electron-hole pairs when receiving radiation.

Figure 2:
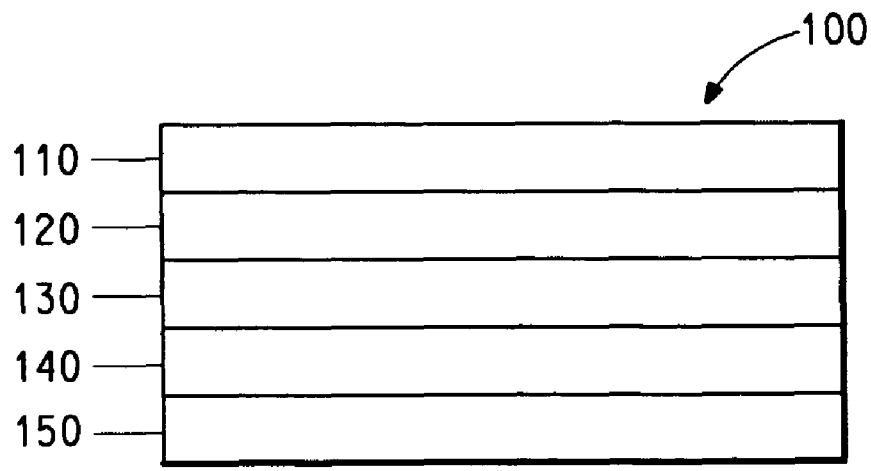
FIG. 2 is a schematic diagram of an organic electronic device.

As shown in FIG. 2, a typical device, 100, has an anode layer 110, a buffer layer 120, an electroactive layer 130, and a cathode layer 150. Adjacent to the cathode layer 150 is an optional electron-injection/transport layer 140.

The device may include a support or substrate (not shown) that can be adjacent to the anode layer 110 or the cathode layer 150. Most frequently, the support is adjacent the anode layer 110. The support can be flexible or rigid, organic or inorganic. Examples of support materials include, but are not limited to, glass, ceramic, metal, and plastic films.

The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), indium-zinc-oxide, aluminum-tin-oxide, gold, silver, copper, and nickel. The anode may also comprise an organic material, especially a conducting polymer such as polyaniline, including exemplary materials as described in "Flexible light-emitting diodes made from soluble conducting polymer," Nature vol. 357, pp 477 479 (11 Jun. 1992). At least one of the anode and cathode should be at least partially transparent to allow the generated light to be observed.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

In one embodiment, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used.

The buffer layer 120 is usually deposited onto substrates using a variety of techniques well-known to those skilled in the art. Typical deposition techniques, as discussed above, include vapor deposition, liquid deposition (continuous and discontinuous techniques), and thermal transfer.

An optional layer, not shown, may be present between the buffer layer 120 and the electroactive layer 130. This layer may comprise hole transport materials. Examples of hole transport materials for layer 120 have been summarized, for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4"-tris(N, N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, poly(9,9,-dioctyl-fluorene-co-N-(4-butylphenyl)diphenylamine), and the like, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

Depending upon the application of the device, the electroactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the electroactive material is an organic electroluminescent ("EL") material. Any EL material can be used in the devices, including, but not limited to, small molecule organic fluorescent compounds, fluorescent and phosphorescent metal complexes, conjugated polymers, and combinations and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); tetra(8-hydroxyquinolato)zirconium (ZrQ), cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal chelated oxinoid compounds, such as bis(2-methyl-8-quinolinato)(para-phenyl-phenolato)aluminum(III) (BAlQ), tetra(8-hydroxyquinolato)zirconium (ZrQ), and tris(8-hydroxyquinolato)aluminum (Alq$_3$); azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and any one or more combinations thereof. Alternatively, optional layer 140 may be inorganic and comprise BaO, LiF, Li$_2$O, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li,Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In some embodiments, the cathode layer will be patterned, as discussed above in reference to the anode layer 110.

Other layers in the device can be made of any materials which are known to be useful in such layers upon consideration of the function to be served by such layers.

In some embodiments, an encapsulation layer (not shown) is deposited over the contact layer 150 to prevent entry of undesirable components, such as water and oxygen, into the device 100. Such components can have a deleterious effect on the organic layer 130. In one embodiment, the encapsulation layer is a barrier layer or film. In one embodiment, the encapsulation layer is a glass lid.

Though not depicted, it is understood that the device 100 may comprise additional layers. Other layers that are known in the art or otherwise may be used. In addition, any of the above-described layers may comprise two or more sub-layers or may form a laminar structure. Alternatively, some or all of anode layer 110, the buffer layer 120, the electron transport layer 140, cathode layer 150, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In various embodiments, the different layers have the following ranges of thicknesses: anode 110, 500-5000 Å, in one embodiment 1000-2000 Å; buffer layer 120, 50-2000 Å, in one embodiment 200-1000 Å; optional hole transport layer, 50-2000 Å, in one embodiment 100-1000 Å; photoactive layer 130, 10-2000 Å, in one embodiment 100-1000 Å; optional electron transport layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components of the invention. This is done merely for convenience and to give a general sense of the invention. This description should be read to include one or at least one and the singular also includes the plural unless it is obvious that it is meant otherwise.

The term "hole transport" when referring to a layer, material, member, or structure, is intended to mean such layer, material, member, or structure facilitates migration of positive charges through the thickness of such layer, material, member, or structure with relative efficiency and small loss of charge.

The term "electron transport" means when referring to a layer, material, member or structure, such a layer, material, member or structure that promotes or facilitates migration of negative charges through such a layer, material, member or structure into another layer, material, member or structure.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode).

Unless otherwise defined, all technical and scientific terms used herein have the same meaning as commonly understood by one of ordinary skill in the art to which this invention belongs. In the Formulae, the letters Q, R, T, W, X, Y, and Z are used to designate atoms or groups which are defined within. All other letters are used to designate conventional atomic symbols. Group numbers corresponding to columns within the Periodic Table of the elements use the "New Notation" convention as seen in the CRC *Handbook of Chemistry and Physics,* 81$^{st}$ Edition (2000).

Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

EXAMPLES

Example 1

This example illustrates the oxidative copolymerization of 3,4-ethylenedioxythiophene (EDT) and pyrrole in the presence of Nafion®. The Nafion® was a 23.3% (w/w) aqueous colloidal dispersion of perfluroethylenesulfonic acid with an EW of 1017.7 is made using a procedure similar to the procedure in U.S. Pat. No. 6,150,426, Example 1, Part 2, except that the temperature is approximately 270° C. Nafion® is an organic solvent non-wettable acid. 49.62 g (11.37 mmoles) of the Nafion® described above was added to a 500 mL resin kettle. To the Nafion® 285.8 g deionized and 0.2448 g 37% (w/w) HCl solution were added separately. A stock solution of ferric sulfate was made first by dissolving 0.0446 g ferric sulfate hydrate (97%, Sigma-Aldrich Corp., St. Louis, Mo., USA) with deionized water to a total weight of 6.8667 g. 5.43 g (0.0682 mmoles) of the ferric sulfate solution were added to the acid/water mixture. While the mixture is being stirred at 200 RPM using an overhead stirrer fitted with a stirring blade, a solution of sodium persulfate was made by dissolving 1.23 g sodium persulfate (Fluka, Sigma-Aldrich Corp., St. Louis, Mo., USA) with deionized water to a total weight of 9.47 g (5.17 mmol). The sodium persulfate solution and 0.22 mL (2.064 mmoles) ethylenedioxythiophene (EDT)/0.143 mL (2.061 mmoles) pyrrole mixture were added to the acid/water/catalyst mixture in 14 hours at a constant rate while continuous stirring at 200 RPM. The addition of the monomer mixture and the $Na_2S_2O_8$/water solution was accomplished by placing them in a separate syringe connected to a Teflon® tube. The end of the Teflon® tube connecting the syringe was placed above the reaction mixture such that the injection involved individual drops falling from the end of the tube. The reaction is stopped in 7.4 hours after completion of the addition. An aliquot of 53.2 g polymerization mixture was taken and the rest was added with 24.7 g of Lewatit MP62WS and 24.9 g Lewatit Monoplus S100 ion-exchange resins to the reaction mixture and stirring it further for 5 hours. The ion-exchange resins were finally removed from the dispersion using Whatman No. 4 filter paper. The yield is 200 g. The entire samples was further treated with 20 g Amberlyst 15. Particle size count measured with an Accusizer (Model 780A, Particle sizing System, Santa Barbara, Calif.) was 0.6 million particles in each 1 mL of dispersion where the particles are greater than 0.75 µm. UV/Vi/near-IR shows that EDT and pyrrole forms copolymer. pH of the dispersion is about 1 and conductivity of dried film backed at 130° C. in air for five minutes was measured to be $8.3 \times 10^{-7}$ S/cm. The dried film is not wettable with p-xylene. The liquid balls up when placed on the film surface.

The aqueous pyrrole/EDT copolymer dispersion was spun on a 6"×6" glass plate. The plate had an ITO thickness of 100 to 150 nm and consisted of 16 backlight substrates. Each substrate consisted of 3 pieces of 5 mm×5 mm pixel and 1 piece of 2 mm×2 mm pixel for light emission. The spin-coated films as buffer layer layers were then baked at 130 C for 5 minutes on a hot plate in air. The thickness of the baked buffer layers was about 80 nm. For the light-emitting layer, a 1% (w/v) p-xylene solution of a green polyfluorene light-emitting polymer was spin-coated on top of the buffer layer films and subsequently baked at 1300 C for 10 minutes on a hot plate in an inert atmosphere dry box. The thickness of the baked films was 75 nm. Immediately after, a 3 nm thick barium layer and a 350-400 nm aluminum layer were deposited on the green light-emitting polymer films to serve as a cathode. The resulting devices have an efficiency of 18cd/A@ 1000 cd/m$^2$. Half-life of the devices is about 400 hours @5,000 cd/m$^2$.

Example 2

This example illustrates preparation of an organic solvent wettable sulfonic acid polymer to be used in the preparation of a new conductive copolymer composition illustrated in Example 3. The acid polymer is a copolymer of tetrafluoroethylene (TFE) and 3,3,4-trifluoro-4-(perfluorosulfonylethoxy)-tricyclo[4.2.1.0$^{2,5}$]-non-7-ene (NBD-PSEVE), which is subsequently converted to the sulfonic acid form. The resulting polymer is abbreviated as "TFE/NBD-PSEVE".

a) Synthesis of 3,3,4-trifluoro-4-(perfluorosulfonylethoxy)-tricvclo[4.2.1.0$^{2,5}$]-non-7-ene (NBD-PSEVE):

A 1000 mL Hastelloy C276 reaction vessel was charged with a mixture of 2,5-norbornadiene (98%, Aldrich, 100 g), and hydroquinone (0.5 g). The vessel was cooled to −6° C., evacuated to −20 PSIG, and purged with nitrogen. The pressure was again reduced to −20 PSIG and 2-(1,2,2-trifluorovinyloxy)-1,1,2,2-tetrafluoroethanesulfonyl fluoride (305 g) was added. The vessel was agitated and heated to 190° C. at which time the inside pressure was 126 PSIG. The reaction temperature was maintained at 190° C. for 6 h. The pressure dropped to 47 PSIG at which point the vessel was vented and cooled to 25° C.

The crude monomer was distilled using a spinning-band column (BP=110-120° C. @ 40 Torr, 2100 RPM) to afford 361 g of colorless liquid consisting of a mixture of isomers. The chemical structure was confirmed by both GCMS and $^{19}$F and $^1$H NMR. MS: m/e 372 (M$^+$), 353 (base, M$^+$−F), 289 (M$^+$−SO$_2$F), 173 (C$_9$H$_8$F$_3^+$).

b) Synthesis of a TFE and NBD-PSEVE Sulfonyl Fluoride Copolymer:

A 400 mL pressure vessel was swept with nitrogen and charged with 74.4 g (0.20 mol) of NBD-PSEVE, 50 mL of Solkane 365 mfc (1,1,1,3,3-pentafluorobutane) and 0.80 g of Perkadox®16N. The vessel was closed, cooled in dry ice, evacuated, and charged with 30 g (0.30 mol) of TFE. The vessel contents were heated to 50° C. and agitated for 18 hr as the internal pressure decreased from 194 psi to 164 psi. The vessel was cooled to room temperature and vented to one atmosphere. The vessel contents were added slowly to excess hexane. The solid was filtered, washed with hexane and dried in a vacuum oven at about 80° C. There was isolated 32.3 g of the white copolymer. Its fluorine NMR spectrum showed peaks at +44.7 (1F, SO$_2$F), −74 to −87 (2F, OCF$_2$), −95 to −125 (CF$_2$, 4F from NBD-PSEVE and 4F from TFE), −132.1 (1F, CF). From integration of the NMR, polymer composition was calculated to be 48% TFE and 52% NBD-PSEVE. GPC analysis: Mn=9500, Mw=17300, Mw/Mn=1.82. DSC: Tg at 207° C. Anal. Found: C, 33.83; H, 1.84; F, 45.57.

b) Hydrolysis of a TFE/NBD-PSEVE Sulfonyl Fluoride Copolymer for Conversion to Acid Copolymer:

22.53 g (48.5 mmoles —SO$_2$F) TFE/NBD-PSEVE were placed in a 1000 mL distillation flask. This flask was equipped with a magnetic stirrer, condenser and nitrogen inlet adapter. To the flask, 350 mL methanol/water mixture (1:1 v/v) and 19.24 g (200 mmoles) ammonium carbonate were added. The flask was then immersed in an oil bath heated to 75° C. for 24 hours. $^{19}$F-NMR shows the absence of ~δ40, indicating that the sulfonyl fluoride was hydrolyzed to below the detection limit.

The entire content (~376 g) of the hydrolyzed mixture was further treated for conversion to acid. 30 g protonic exchange resins were added to the mixture and left stirred for 1 hr. The resin was filtered and fresh 30 g acidic resins were added and left stirred for 15 hrs and filtered again. The filtrate was treated with fresh 20 g acidic resins for half an hour and again the filtrate was treated with fresh 30 g acidic resins for half an hour. The final filtrate was then placed in around bottom flask which was immersed in an oil bath heated to 60° C. Once two thirds of the content were removed through evaporation, the oil bath heat was turned off until the content became dried. Dried solid, which was yellowish, weighed 18.5 g.

A few pieces of the solid was dissolved in water which turned into acidic. Couple drops of the solution was cast on a microscope slide. It formed a smooth continuous film. The film surface can be wetted easily with p-xylene, which is one of common solvents for light emitting materials.

Example 3

This example will illustrate oxidative copolymerization of 3,4-ethylenedioxythiophene(EDT) and pyrrole in the presence of TFE/NBD-PSEVE prepared in Example 2. The TFE/NBD-PSEVE is a solid and has EW of 462.6. The acid film is an organic solvent wettable acid.

5.25 g (11.37 mmoles) TFE/NBD-PSEVE and 183.5 g deionized water will be added to a 500 mL resin kettle. To the acid solution, 0.2448 g (2.484 mmoles) 37% (w/w) HCl solution will be added. A stock solution of ferric sulfate will be made first by dissolving 0.0446 g ferric sulfate hydrate (97%, Sigma-Aldrich Corp., St. Louis, Mo., USA) with deionized water to a total weight of 6.8667 g. 5.43 g (0.0682 mmoles) of the ferric sulfate solution will be added to the acid/water mixture. While the mixture is being stirred at 200 RPM using an overhead stirrer fitted with a stirring blade, a solution of sodium persulfate was made by dissolving 1.23 g sodium persulfate (Fluka, Sigma-Aldrich Corp., St. Louis, Mo., USA) with deionized water to a total weight of 9.47 g (5.17 mmol). The sodium persulfate solution and 0.22 mL (2.064 mmoles) ethylenedioxythiophene (EDT)/0.143 mL (2.061 mmoles) pyrrole mixture will be added to the acid/water/catalyst mixture in 14 hours at a constant rate while continuous stirring at 200 RPM. The addition of the moomer mixture and the Na$_2$S$_2$O$_8$/water solution will be accomplished by placing them in a separate syringe connected to a Teflon® tube. The end of the Teflon® tube connecting the syringe will be placed above the reaction mixture such that the injection will involve individual drops falling from the end of the tube. The reaction will be stopped in 7.4 hours after completion of the addition by adding 30 g of Lewatit MP62WS and 30 g Lewatit Monoplus S100 ion-exchange resins to the reaction mixture and stirring it further for 5 hours. The ion-exchange resins will be removed from the dispersion using a Whatman filter paper. UV/Vis/near-IR and Particle size count and light emitting device will be performed using the dispersion at different pH.

Example 4

This example illustrates the preparation of an organic solvent wettable sulfonic acid polymer to be used in the preparation of a new conductive copolymer composition. Films made with the new conductive copolymer composition have a low contact angle for improved surface wettability by organic liquids. The polymer is a copolymer of 1,1-difluoroethylene ("VF$_2$") and 2-(1,1-difluoro-2-(trifluoromethyl)allyloxy)-1,1,2,2-tetrafluoroethanesulfonyl fluoride ("PSEBVE"), which has been converted to the sulfonic acid form. The resulting polymer is referred to as "VF$_2$-PSEBVE".

Glossary:

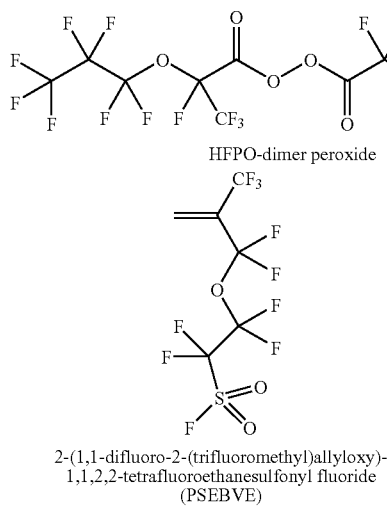

HFPO-dimer peroxide 2-(1,1-difluoro-2-(trifluoromethyl)allyloxy)-
1,1,2,2-tetrafluoroethanesulfonyl fluoride
(PSEBVE)

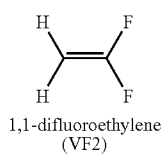

1,1-difluoroethylene
(VF2)

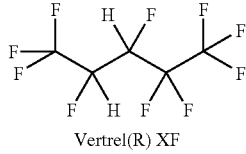

Vertrel(R) XF

A 400 mL Hastelloy C276 reaction vessel was charged with 160 mL of Vertrel® XF, 4 mL of a 20 wt. % solution of HFPO dimer peroxide in Vertrel® XF, and 143 g of PSEBVE (0.42 mol). The vessel was cooled to −35° C., evacuated to −3 PSIG, and purged with nitrogen. The evacuate/purge cycle was repeated two more times. To the vessel was then added 29 g VF$_2$ (0.45 mol). The vessel was heated to 28° C., which increased the pressure to 92 PSIG. The reaction temperature was maintained at 28° C. for 18 h. at which time the pressure had dropped to 32 PSIG. The vessel was vented and the crude liquid material was recovered. The Vertrel® XF was removed in vacuo to afford 110 g of desired copolymer.

Conversion of the sulfonyl fluoride copolymer prepared above to sulfonic acid was carried out in the following manner. 20 g of dried polymer and 5.0 g lithium carbonate were refluxed in 100 mL dry methanol for 12 h. The mixture was brought to room temperature and filtered to remove any remaining solids. The methanol was removed in vacuo to isolate the lithium salt of the polymer. The lithium salt of the polymer was then dissolved in water and added with Amberlyst 15, a protonic acid exchange resin which had been washed thoroughly with water until there was no color in the water. The mixture was stirred and filtered. Filtrate was added with fresh Amberlyst 15 resin and filtered again. The step was repeated two more times. Water was then removed from the final filtrates and the solids were then dried in a vacuum oven.

Films made from VF$_2$-PSEBVE acid are wettable by organic solvents. Phenylhexane will have a contact angle less than 40° on the films.

Example 5

This example illustrates the prepartion of an organic solvent wettable sulfonic acid polymer to be used in the preparation of a new conductive polymer composition. Films made with the new conductive polymer composition have a low contact angle for improved surface wettability by organic liquids. The polymer is a copolymer of ethylene ("E") and 2-(2-(1,2,2-trifluorovinyloxy)-1,1,2,3,3,3-hexafluoropropoxy)-1,1,2,2-tetrafluoroethanesulfonyl fluoride ("PSEPVE"), which as been converted to the sulfonic acid form. The resulting polymer is referred to as "E-PSEPVE acid".

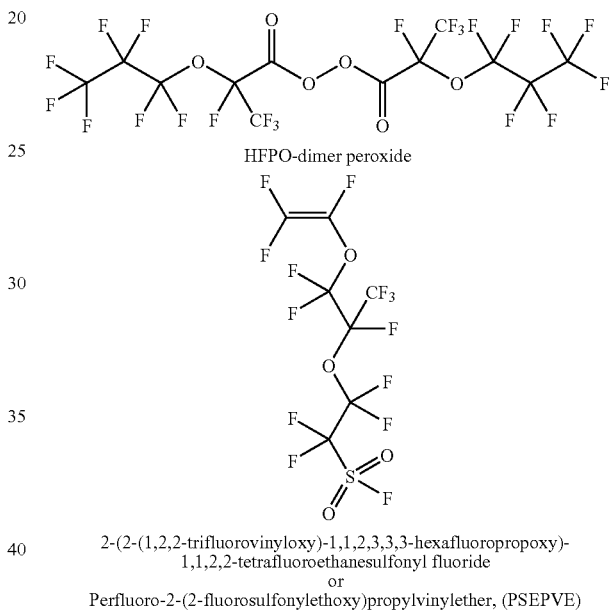

2-(2-(1,2,2-trifluorovinyloxy)-1,1,2,3,3,3-hexafluoropropoxy)-
1,1,2,2-tetrafluoroethanesulfonyl fluoride
or
Perfluoro-2-(2-fluorosulfonylethoxy)propylvinylether, (PSEPVE)

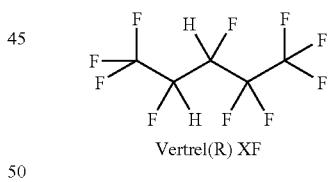

Vertrel(R) XF

A 210 mL Hastelloy C276 reaction vessel was charged with 60 g of PSEPVE (0.13 mol) and 1 mL of a 0.17 M solution of HFPO dimer peroxide in Vertrel® XF. The vessel was cooled to −35° C., evacuated to −3 PSIG, and purged with nitrogen. The evacuate/purge cycle was repeated two more times. To the vessel was then added 20 g ethylene (0.71 mol) and an additional 900 PSIG of nitrogen gas. The vessel was heated to 24° C., which increased the pressure to 1400 PSIG. The reaction temperature was maintained at 24° C. for 18 h. at which time the pressure had dropped to 1350 PSIG. The vessel was vented and 61.4 g of crude material was recovered. 10 g of this material were dried at 85° C. and 20 milliTorr for 10 h. to give 8.7 g of dried polymer.

Conversion of the sulfonyl fluoride copolymer prepared above to sulfonic acid was carried out in the following manner. A mixture of 19.6 g of dried polymer and 5.6 g lithium carbonate were refluxed in 300 mL dry methanol for 6 h. The mixture was brought to room temperature and filtered to remove any remaining solids. The methanol was removed in vacuo to afford 15.7 g of the lithium salt of the polymer. The lithium salt of the polymer was then dissolved in water and added with Amberlyst 15, a protonic acid exchange resin which had been washed thoroughly with water until there was no color in the water. The mixture was stirred and filtered. Filtrate was added with fresh Amberlyst 15 resin and filtered again. The step was repeated two more times. Water was then removed from the final filtrates and the solids were then dried in a vacuum oven. Films made from E-PSEPVE acid are wettable by organic solvents. Phenylhexane will have a contact angle less than 40° on the films.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

What is claimed is:

1. An electrically conductive polymer composition comprising an aqueous dispersion of:
    at least one electrically conductive copolymer; and
    at least one fluorinated acid polymer which comprises siloxane sulfonic acid pendant groups.

2. An electrically conductive polymer composition of claim 1 wherein each copolymer comprises more than one independently substituted or unsubstituted monomer selected from the group consisting of thiophenes, pyrroles, anilines, fused polycyclic heteroaromatics, and polycyclic heteroramatics.

3. An electrically conductive polymer composition of claim 2 wherein the thiophenes have structure represented by formulas selected from the group consisting of Formula I and Formula Ia:

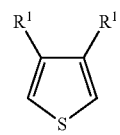

(I)

wherein:
$R^1$ is independently selected so as to be the same or different at each occurrence and is hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and

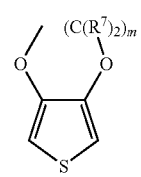

(Ia)

wherein:
$R^7$ is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^7$ is not hydrogen, and
m is 2 or 3.

4. An electrically conductive polymer composition of claim 2 wherein the pyrroles have structure represented by Formula II:

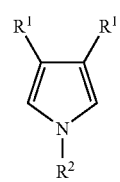

(II)

wherein:
$R^1$ is independently selected so as to be the same or different at each occurrence and is hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and R² is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

5. An electrically conductive polymer composition of claim 2 wherein the anilines have structure represented by formulas selected from Formula III, Formula IVa, and Formula IVb:

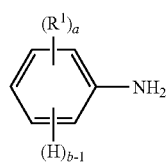

(III)

wherein:

a is 0 or an integer from 1 to 4;

b is an integer from 1 to 5, with the proviso that a+b=5; and

R¹ is independently selected so as to be the same or different at each occurrence and is hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both R¹ groups together may form an alkylene or alkenylene chain completing a 3, 4, 5, 6, or 7-membered aromatic or alicyclic ring, which ring may optionally include one or more divalent nitrogen, sulfur or oxygen atoms;

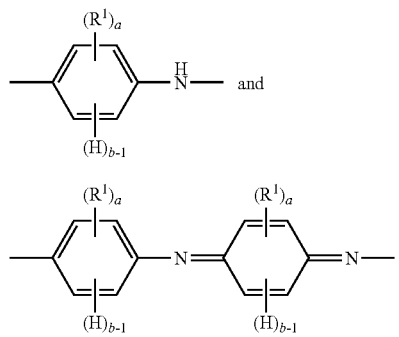

where a, b and R¹ are as defined above.

6. An electrically conductive polymer composition of claim 5 wherein the aniline monomer represented by Formula IVa or IVb is unsubstituted.

7. An electrically conductive polymer composition of claim 2 wherein the fused polycyclic heteroaromatics have structure represented by formulas selected from Formula V, and Formulas Va-Vg:

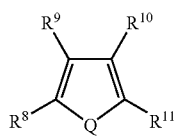

(V)

wherein:

Q is S or NR⁶;

R⁶ is hydrogen or alkyl;

R⁸, R⁹, R¹⁰, and R¹¹ are independently selected so as to be the same or different at each occurrence and are selected from the group consisting of hydrogen, alkyl, alkenyl, alkoxy, alkanoyl, alkythio, aryloxy, alkyithioalkyl, alkylaryl, arylalkyl, amino, alkylamino, dialkylamino, aryl, alkylsulfinyl, alkoxyalkyl, alkylsulfonyl, arylthio, arylsulfinyl, al koxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; and at least one of R⁸ and R⁹, R⁹ and R¹⁰, and R¹⁰ and R¹¹ together form an alkenylene chain completing a 5 or 6-membered aromatic ring, which ring may optionally include one or more divalent nitrogen, sulfur or oxygen atoms; and

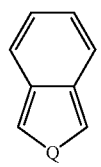

(Va)

(Vb)

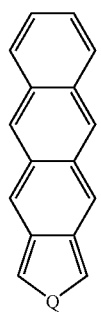

(Vc)

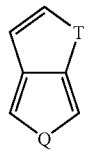

(Vd)

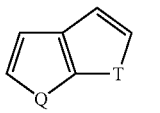 (Ve)

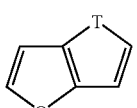 (Vf)

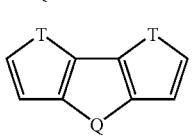 (Vg)

wherein:
Q is S or NH; and
T is the same or different at each occurrence and is selected from S, $NR^6$, O, $SiR^6_2$, Se, and $PR^6$;
$R^6$ is hydrogen or alkyl.

8. An electrically conductive polymer composition of claim 7 wherein the monomer represented by Formulas Vd, Ve, or Vf is a thienothiophene.

9. An electrically conductive polymer composition of claim 2 wherein the polycyclic heteroaromatics have structure represented by Formula VI:

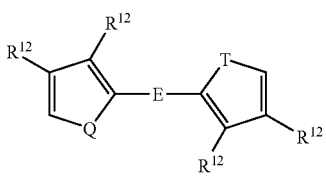 (VI)

wherein:
Q is S or $NR^6$;
T is S, $NR^6$, O, $SiR^6_2$, Se, and $PR^6$;
E is alkenylene, arylene, and heteroarylene;
$R^6$ is hydrogen or alkyl;
$R^{12}$ is the same or different at each occurrence and is hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; or two groups together may form an alkylene or alkenylene chain completing a 3, 4, 5, 6, or 7-membered aromatic or alicyclic ring, which ring may optionally include one or more divalent nitrogen, sulfur or oxygen atoms.

10. An electrically conductive polymer composition of claim 2 wherein the pyrrole monomer is unsubstituted.

11. An electrically conductive polymer composition of claim 1 wherein each fluorinated acid polymer comprises one or more independently substituted or unsubstituted monomers selected from the group consisting of styrene sulfonic acids or sulfonated ether sulfones, trifluorostyrene sulfonates, sulfonimides, perfluoroalkyl sulfonate ethers, fused polycyclic fluorinated acids, and perfluoroalkyl sulfonic acid ethers.

12. An electrically conductive polymer composition of claim 11 wherein the styrene sulfonic acids or sulfonated ether sulfones have structure represented by Formula VII:

 (VII)

where:
b is an integer from 1 to 5,
$R^{13}$ is OH or $NHR^{14}$, and
$R^{14}$ is alkyl, fluoroalkyl, sulfonylalkyl, or sulfonylfluoroalkyl.

13. An electrically conductive polymer composition of claim 12 wherein the monomer represented by Formula VII is selected from SFS and SFSI.

14. An electrically conductive polymer composition of claim 11 wherein the trifluorostyrene sulfonates have structure represented by Formula VIII:

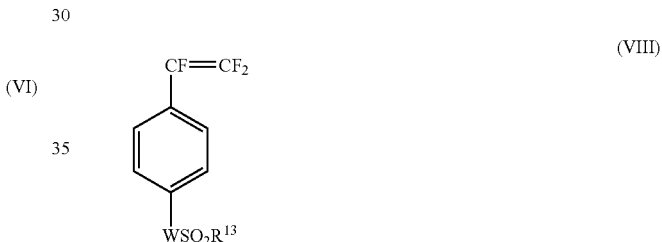 (VIII)

where:
W is $(CF_2)_q$, $O(CF_2)_q$, $S(CF_2)_q$, $(CF_2)_qO(CF_2)_r$, and $SO_2(CF_2)_q$,
b is independently an integer from 1 to 5,
$R^{13}$ is OH or $NHR^{14}$, and
$R^{14}$ is alkyl, fluoroalkyl, sulfonylalkyl, or sulfonylfluoroalkyl.

15. An electrically conductive polymer composition of claim 11 wherein the sulfonimides have structure represented by Formula IX:

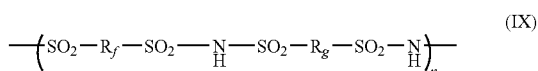 (IX)

where:
$R_f$ is fluorinated alkylene, fluorinated heteroalkylene, fluorinated arylene, or fluorinated heteroarylene;
$R_g$ is fluorinated alkylene, fluorinated heteroalkylene, fluorinated arylene, fluorinated heteroarylene, arylene, or heteroarylene; and
n is at least 4.

16. An electrically conductive polymer composition of claim 11 wherein the perfluoroalkyl sulfonate ethers have structure represented by Formula XI:

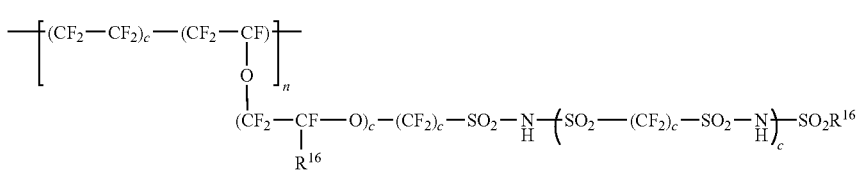

(XI)

where:

$R^{16}$ is a fluorinated alkyl or a fluorinated aryl group;

a, b, c, d, and e are each independently 0 or an integer from 1 to 4; and n is at least 4.

17. An electrically conductive polymer composition of claim 11 wherein the fused polycyclic fluorinated acids have structure represented by formulas selected from the group consisting of Formula XII and Formulas XIIa-XIIe:

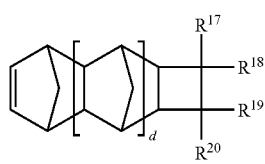

(XII)

wherein d is 0, 1, or 2;

$R^{17}$ to $R^{20}$ are independently H, halogen, alkyl or alkoxy of 1 to 10 carbon atoms, Y, $C(R_f^t)(R_f^t)OR^{21}$, $R^4Y$ or $OR^4Y$; Y is $COE^2$, $SO_2 E^2$, or sulfonimide;

$R^{21}$ is hydrogen or an acid-labile protecting group;

$R_f^t$ is the same or different at each occurrence and is a fluoroalkyl group of 1 to 10 carbon atoms, or taken together are $(CF_2)_e$ where e is 2 to 10;

$R^4$ is an alkylene group;

$E^2$ is OH, halogen, or $OR^7$; and $R^5$ is an alkyl group;

with the proviso that at least one of $R^{17}$ to $R^{20}$ is Y, $R^4Y$ or $OR^4Y$;

$R^4$, $R^5$, and $R^{17}$ to $R^{20}$ may optionally be substituted by halogen or ether oxygen; and

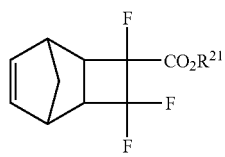

(XIIa)

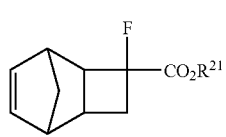

(XIIb)

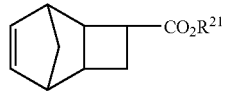

(XIIc)

-continued

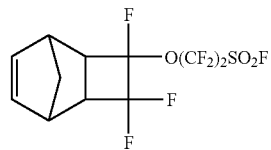

(XIId)

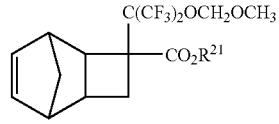

(XIIe)

wherein $R^{21}$ is a group capable of forming or rearranging to a tertiary cation, more typically an alkyl group of 1 to 20 carbon atoms, and most typically t-gbutyl.

18. An electrically conductive polymer composition of claim 1 wherein the copolymer comprises two or more conductive precursor monomers.

19. An electrically conductive polymer composition of claim 1 wherein the copolymer comprises at least one conductive copolymer and at least one non-conductive copolymer.

20. An electrically conductive polymer composition of claim 1 wherein fluorinated acid polymer comprises a polymeric backbone having pendant groups of the general formula:

$$-O_aSi(OH)_{b-a}R^{22}{}_{3-b}R^{23}R_f SO_3H$$

wherein:

a is from 1 to b;

b is from 1 to 3;

$R^{22}$ is a non-hydrolyzable group independently selected from the group consisting of alkyl, aryl, and arylalkyl;

$R^{23}$ is a bidentate alkylene radical, which may be substituted by one or more ether oxygen atoms, with the proviso that $R^{23}$ has at least two carbon atoms linearly disposed between Si and $R_f$; and $R_f$ is a perfluoroalkylene radical, which may be substituted by one or more ether oxygen atoms.

21. An electrically conductive film made from the composition of claim 20.

22. An electrically conductive polymer composition of claim 1 wherein the fluorinated acid polymer is a colloid-forming polymeric acid.

23. An electrically conductive polymer composition of claim 22 wherein the colloid-forming polymeric acid is an FSA polymer.

24. An electrically conductive polymer composition of claim 1 wherein the fluorinated acid polymer component forms a film that is organic solvent wettable.

25. An electrically conductive polymer composition of claim 1 wherein the fluorinated acid polymer component forms a film that is organic solvent non-wettable.

26. An electrically conductive polymer composition of claim 1 comprising a buffer.

27. An organic electronic device comprising an electrically conductive polymer composition of claim 1.

28. An electrically conductive film made from the composition of claim 1.

* * * * *